United States Patent
Rezeanu

(10) Patent No.: US 8,239,658 B2
(45) Date of Patent: Aug. 7, 2012

(54) INTERNALLY DERIVED ADDRESS GENERATION SYSTEM AND METHOD FOR BURST LOADING OF A SYNCHRONOUS MEMORY

(75) Inventor: Stefan-Cristian Rezeanu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 540 days.

(21) Appl. No.: 11/359,205

(22) Filed: Feb. 21, 2006

(65) Prior Publication Data

US 2007/0198807 A1    Aug. 23, 2007

(51) Int. Cl.
*G06F 9/26* (2006.01)
*G06F 9/34* (2006.01)
*G06F 13/00* (2006.01)
*G06F 13/28* (2006.01)
*G06F 12/00* (2006.01)

(52) U.S. Cl. ............. 711/218; 711/149; 711/219

(58) Field of Classification Search ......... 711/218
See application file for complete search history.

(56) References Cited

U.S. PATENT DOCUMENTS

| | | | |
|---|---|---|---|
| 5,311,468 A | 5/1994 | Anderson | |
| 6,011,751 A | 1/2000 | Hirabayashi | |
| 6,031,785 A | 2/2000 | Park et al. | |
| 6,075,748 A | 6/2000 | Bhullar | |
| 6,212,615 B1 | 4/2001 | Takahashi | |
| 6,304,510 B1 | 10/2001 | Nobunaga et al. | |
| 6,510,483 B1 | 1/2003 | Rezeanu et al. | |
| 6,567,884 B1 | 5/2003 | Rezeanu | |
| 6,782,467 B1 | 8/2004 | Rezeanu | |
| 6,789,180 B1 | 9/2004 | Rezeanu | |
| 2004/0252705 A1* | 12/2004 | Zancan et al. | 370/401 |

OTHER PUBLICATIONS

Written Opinion of the International Searching Authority dated Jul. 23, 2007 for International Application No. PCT/US07/62433; 6 pages.
International Search Report of the International Searching Authority dated Jul. 23, 2007 for International Application No. PCT/US07/62433; 27 pages.

* cited by examiner

*Primary Examiner* — Brian Peugh
*Assistant Examiner* — Prasith Thammavong

(57) ABSTRACT

An address generation system and method is provided for internally storing and thereafter producing an address to be sent to a memory device. The address that is stored need not be sent from an external address bus at each clock cycle, but the processing can remain internal to the memory device. The burst-block starting address can be stored in the mirror register and output from a selector circuit, such as a multiplexer, when that address is chosen. Otherwise, the multiplexer can simply perform its normal operation of selecting between an address pointed to by a counter, the external address, or the incremented counter output, based on the state of the external counter control signals. The system includes a mirror register, a counter, and a multiplexer that selects either the mirror register stored address or the internally processed address.

12 Claims, 5 Drawing Sheets

INTERNALLY DERIVED ADDRESS GENERATION SYSTEM AND METHOD FOR BURST LOADING OF A SYNCHRONOUS MEMORY

BACKGROUND OF THE INVENTION

1. Field of the Invention

The present invention relates to a memory circuit and, more particularly, to a memory that can have a block of address locations synchronously written to or read from in a burst fashion, with the address block bottom address stored in a mirror register, and a counter for incrementally writing to or reading from the memory block at an internally-derived address stored in a counter register and selected using a counter control signal.

2. Description of the Related Art

The following descriptions and examples are given as background only.

A typical mechanism in which to store data involves sending an address to that storage location in order to access that location, and reading from that addressable location, or writing to that addressable location. Accordingly, memory generally includes an address bus and a data bus, as well as control signals which control access thereof.

There are numerous forms of memory, such as mass storage devices or hard drives. Alternatively, memory can be embodied upon silicon or a single monolithic substrate, and such forms are known as semiconductor memory. Popular semiconductor memory includes random access memory (RAM), read only memory (ROM), and programmable read only memory (PROM), etc. Because each form of semiconductor memory operates differently from one another, the addressing of the memory locations and the data bus applicable to those locations, as well as the control signals, remain somewhat unique to one another.

As an example, RAM can be accessed in different ways. In many applications, related data are placed in contiguous locations within the RAM. In order to quickly access that data, a RAM can implement synchronous accessing whereby contiguous address spaces (or possibly non-contiguous spaces) can be accessed at sequential transitions of a clocking signal, rather than having to resort to independent accesses that require taking control of the external address bus. Such forms of memory are often referred to as synchronous memory, and a popular such memory is often labeled synchronous RAM.

If accesses can occur synchronously and if the target data is placed in a relatively contiguous space, then a natural benefit of synchronous memories is to perform a burst read or write operation. Essentially, a burst read or write (burst access) involves performing a load operation of a particular address, and then subsequently incrementing or decrementing a counter to point to the next addressable location until an entire block of addressable locations are accessed. Thus, a burst access involves externally reading a load address upon the external address bus, and then incrementing a counter placed internal to the memory, generally labeled "burst counter". The only access on the external address bus is the initial load operation for the first memory location within the block being read. Thereafter, the counter simply increments or decrements to the next address space. Thus, the data from all address spaces within the block can be accessed by asserting the read/write operation and holding the particular (read or write) chip control signal active for as long as necessary to complete the burst access.

The term external address is generally recognized as the address bus that is external to the memory device or, more specifically, is the address bus coming from an execution unit (i.e., microprocessor) that, in response to an instruction, loads a particular address onto the external address bus that is then sent to the memory or the memory controller. Once the externally-loaded address is placed upon the external address bus and subsequently loaded unto the internal address bus, the memory or memory controller then performs the counter increment or decrement internal to the memory or memory controller. A benefit in performing a burst or block access is that the external address bus is only occupied for the first address. The counter, which might transition much faster than the external address, then takes care of the remaining addressable locations without having to thereafter involve the external address bus.

It may be desirable for the user to know the current memory address location at which the internal counter is pointing at a particular time, as well as the associated data at that address. Therefore, the concept of a read-back occurs whenever the user might implement an instruction through a control signal external to the memory controller or memory device. That instruction can be fed from an external pin or decoded from multiple pins into the memory device, which then instructs the counter to send back the particular address to which it is pointed and/or the data so that the user can then read that correspondence. Examples of an external-derived read-back mechanism in which the counter pointed-to address and data is read back is set forth in, for example, U.S. Pat. Nos. 6,789,180 and 6,782,147.

While there is benefit in knowing where the counter is within the block of data, and reading back the address and corresponding data values, there is even more value in being able to control the counter and the address and/or corresponding data values pointed to by that counter. Therefore, it would be desirable to implement a system which can not only read back the internally-derived (counter value) address and corresponding data, but also generate an address via the count value entirely internal to the memory controller or memory device. By beneficially controlling the count value and, thus, the corresponding address and data values to which that pointer is directed, it would be of even further value to do so without involving or occupying the external address bus.

Therefore, the desired system achieves the stated benefit of being able to derive an address location from among any memory addressable location solely internal to the memory controller or semiconductor memory device without having to take control of, manipulate, or in any way access or place an address upon an external address bus coupled between an execution unit and the memory controller or memory device. This frees up bandwidth on the external address bus and also allows for quicker memory address generation since such generation occurs solely internal to the controller or device without having to contend with or keep track of the pipelined addressing mechanisms normally associated with conventional memories that have priority control signals and coding on the external control signal bus.

SUMMARY OF THE INVENTION

The following description of various embodiments of circuits and methods is not to be construed in any way as limiting the subject matter of the appended claims.

The problems outlined above are in large part solved by a system that can internally load an external address via the external address bus, and thereafter maintain specific addresses that are internally-derived to that system. The system can be at least a part of a memory controller/device, and is maintained internal to the controller/device. The system thereby stores the initially-loaded address coming from the external address bus, and can store those other externally-sent addresses. In addition, the system can store any address pointed to by the internal counter. By storing such addresses, quick recall or retransmit of that address can occur. Thus, if the last externally-sent address is to be retransmitted back to the storage array or address decoder of the memory device, the system simply keeps track of (i.e., stores) the last externally-loaded address within a mirror register internal to the memory controller/device. The last loaded address can then be reloaded solely within or internal to the controller/device without having to seek any information outside of the memory controller/device (i.e., the present system), or involving the external address bus.

Generally, flexibility in selecting particular memory blocks is achieved by giving the internal burst counter the ability to mask certain addresses. This may be achieved by including a mask register that stores the user defined mask configuration (i.e., which counter bits are inactive, labeled as "masked", and which are active, labeled as "unmasked"). The mask configuration is loaded via the external address bus, by activating an external mask load instruction, which requires the external mask load counter control signal activation in a clock cycle when no other higher precedence counter control signal is active.

In addition to being able to quickly jump to the last loaded address, the system can also quickly transition to a zero address within the unmasked memory addressable space. Therefore, the mirror registers can store not only the last loaded address, but also the zero addressable location internal to the controller/device, for quick reloading back onto the address decoder of the memory device without consuming any bandwidth, or accessing or taking control of in any way the external address bus coming from the execution device.

According to one embodiment, the system comprises a maskable counter register for storing an address processed internal to the system as the next address, as well as a mirror register configured to store an address upon receiving a command signal and produce the stored address upon receiving an active clock transition. The command signal can be either sent on the one line within the external command signal for the memory controller/device, or, alternatively, the command signal can be internally-derived by decoding one or more command signals sent externally to the memory controller/device. A generic multiplexer—having the function of a next state address generator—is preferably coupled to receive output from the mirror register and the counter for producing the internally processed address upon receiving a command signal and for sending either the mirror register stored address or the internally processed address to become the next address and be stored in the counter register, from which the next address is configured to be sent to a memory address decoder.

According to another embodiment, the stored address can be the last loaded address sent from the external address bus to the controller/device or an address derived by a mirror address generator coupled to receive the external address and a subset of the internal counter control signals and generate a next mirror address forwarded for storing purposes to the mirror register. The last loaded address might be the first address within a block of addresses that are addressable using a count value that increments upward or downward from that externally-loaded address. Alternatively, the mirror-stored address might simply be an address containing all logic 0 voltage values at least in its unmasked portion, typically associated with the first address within the addressable memory space. By having the mirror register present the last loaded address or the all 0's addressable (unmasked) space—the latter typically expected when the user activates a counter reset instruction, upon receiving either a retransmit (RTX) or a wrap to retransmit-address (WRP0 inactive) command signal in combination with an increment/decrement command when the counter stores its maximum (unmasked) state, the generic multiplexer can selectively send to the counter register the mirror-stored address.

According to yet another embodiment, the memory associated with the memory address decoder can be a single port or multi-port memory. Preferably, the memory is a synchronous memory which performs accesses upon transitions of a clock signal and, therefore, is synchronous to that clock signal. Also, preferably, the memory performs burst accesses (i.e., burst reads or writes) by externally loading an address, and simply counting to the next unmasked address using an internal counter to access all storage locations within the burst block.

The mirror register and the mask register have the same (bit) dimension with the counter register, all of them being components of the internal burst counter. The mirror register would generally store the last loaded address (via the external address bus) when a first (generally a counter load) command signal is activated, or the all logic 0 voltage values in its unmasked bits when a second (counter reset) command signal is activated. The mirror-stored address can be retrieved and sent for storage to the counter register whenever a third command signal is sent to the generic multiplexer. Otherwise, the next address within the count is an internally processed address. The third command signal can either be a retransmit (RTX) or an increment/decrement combined with a counter wrap control (WRP0). The internally processed address is sent to the counter register upon receiving the first or second command signals, but also upon activating an alternate counter control signal (e.g., counter increment).

According to yet another embodiment, a method is provided for addressing memory locations. The method includes storing an address, followed by sequentially incrementing that address. The stored address might be the last loaded address, the unmasked-counter reset address, or might simply be the incremented address of the next counted-to counter value, depending on a logic state of at least one command signal.

BRIEF DESCRIPTION OF THE DRAWINGS

Other objects and advantages of the invention will become apparent upon reading the following detailed description and upon reference to the accompanying drawings in which.

Figure 3:
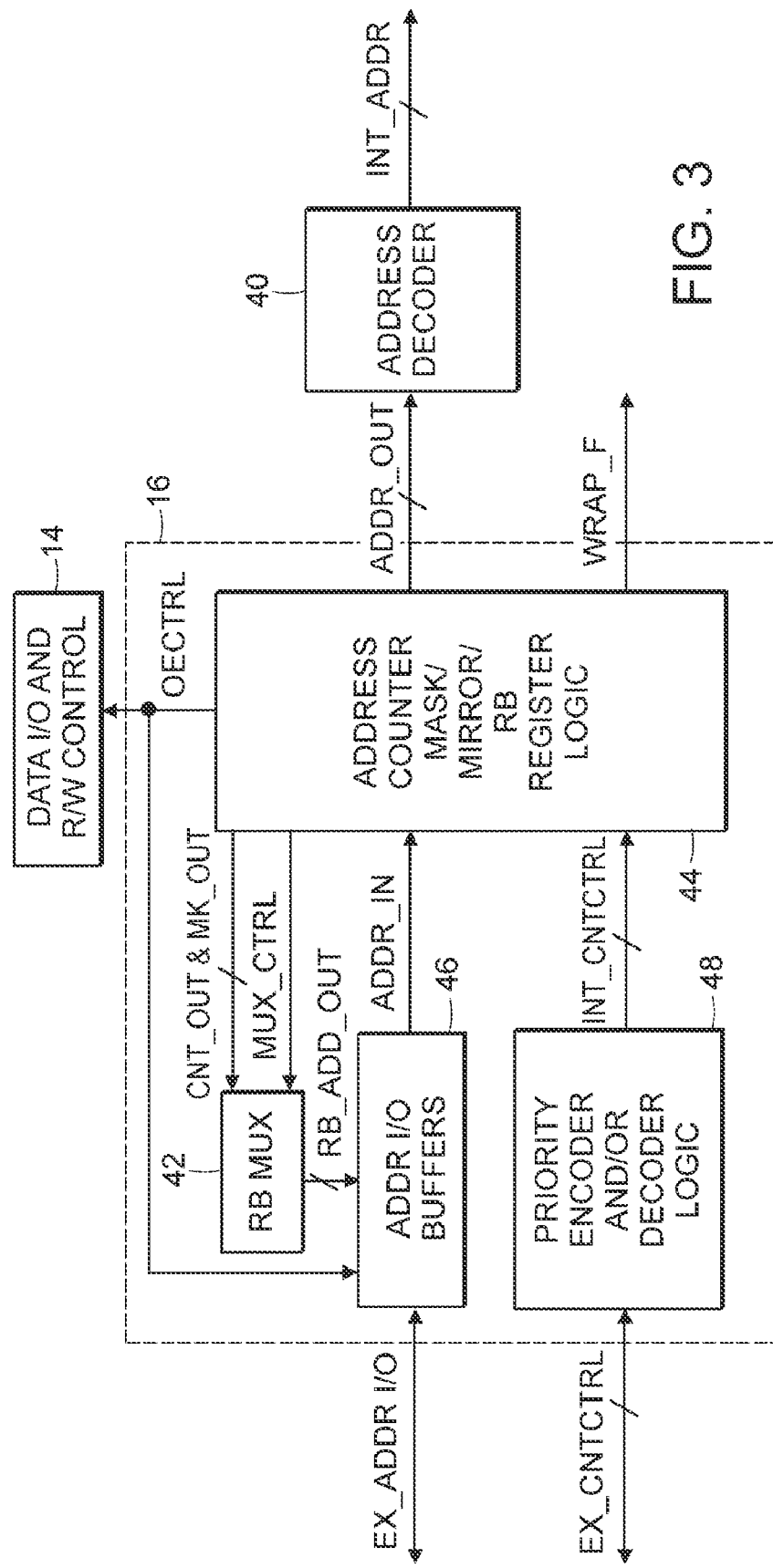
FIG. 3 is a more detailed block diagram of the priority encoder and/or decoder logic and address counter/mask/mirror/read-back register blocks of FIG. 1.
Figure 4:
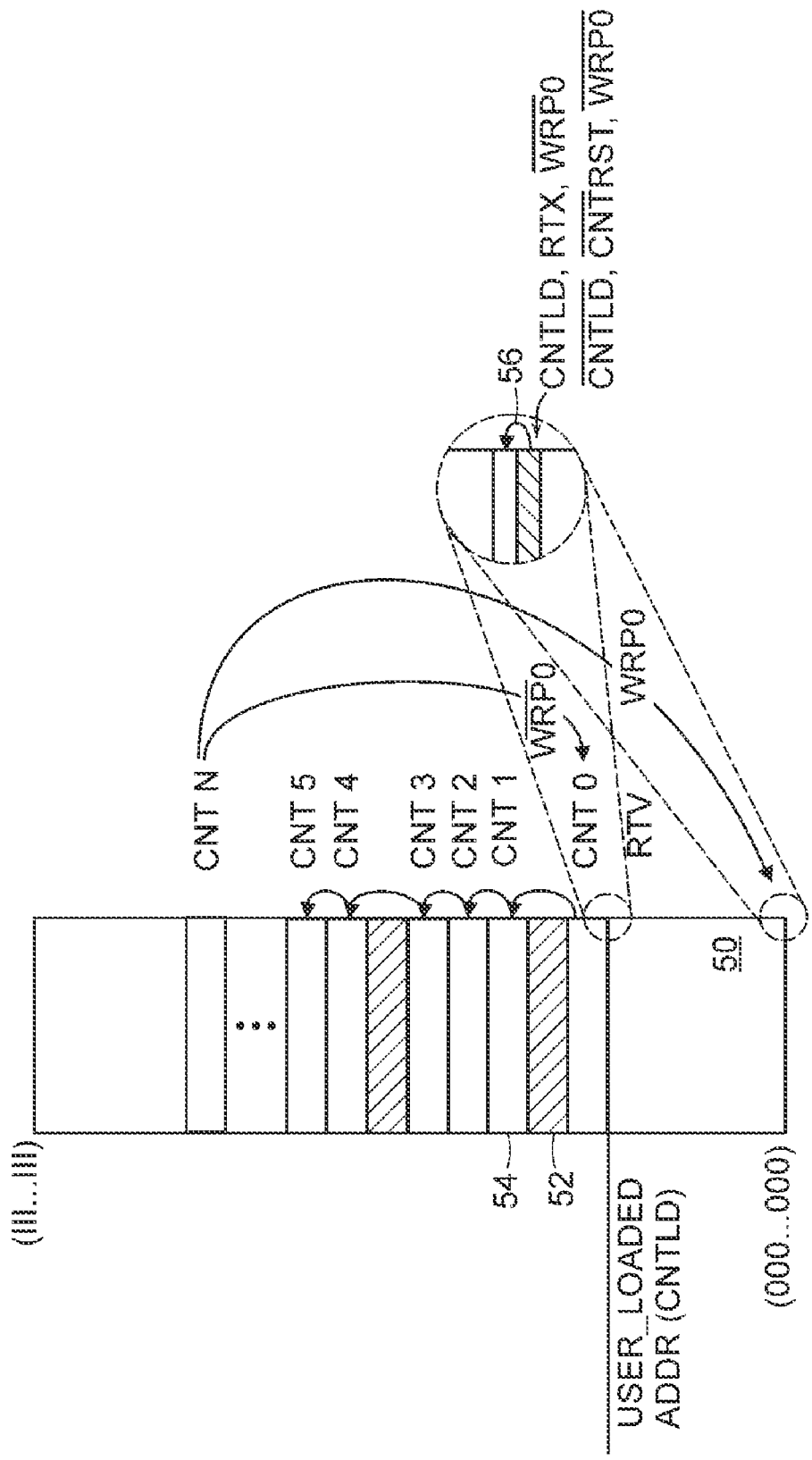
FIG. 4 is a memory address space being incrementally written to or read from, whereupon the counter receives a retransmit (RTX) command signal or is configured to wrap to 0 or the last loaded address (via the state of the external WRP0 counter control signal) that will cause the mirror register to output the last loaded address or zero address, respectively, to be output from the counter to the memory decoder.
Figure 5:
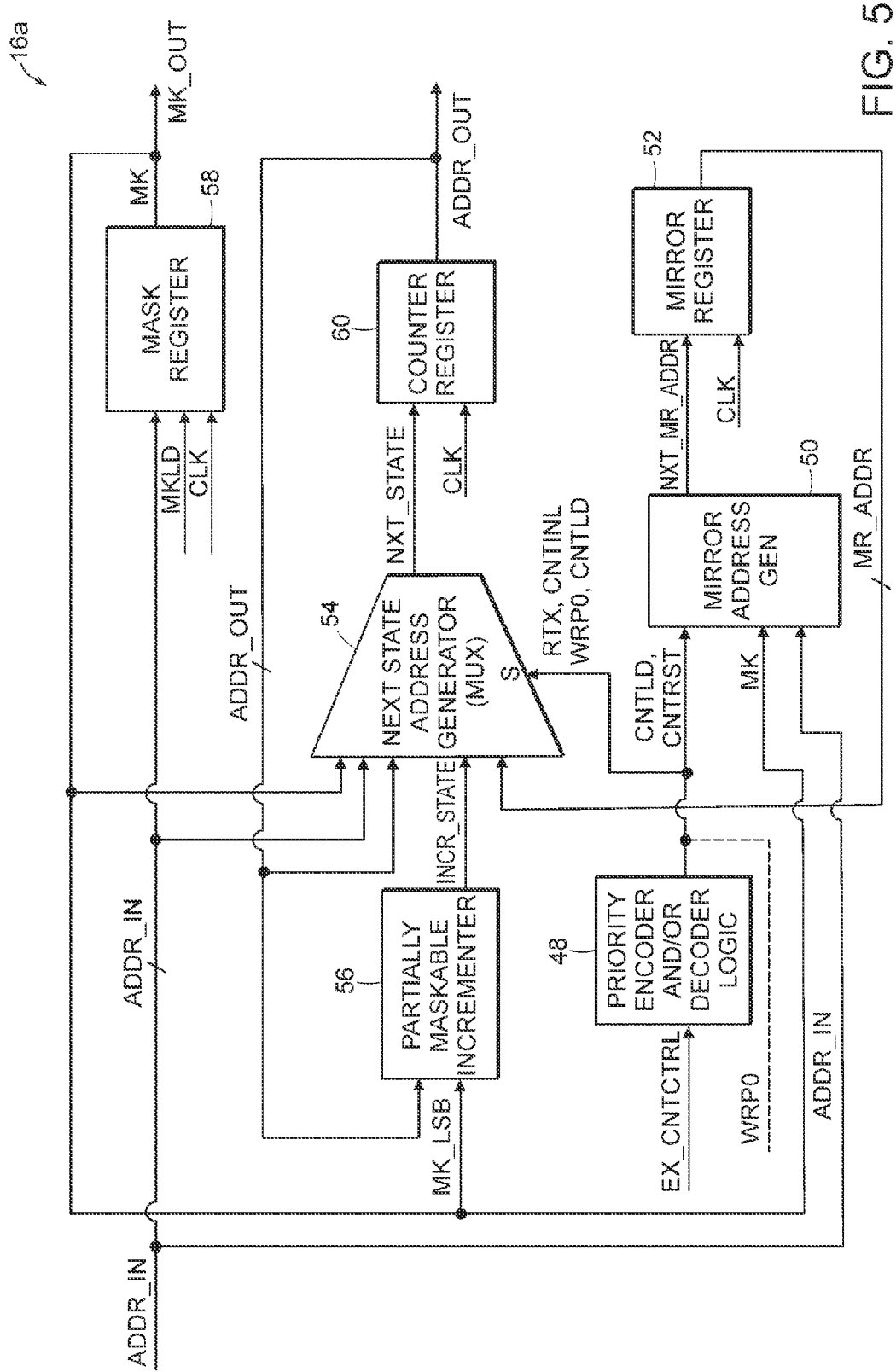

FIG. 5 is only a portion of what is shown in FIG. 3, including more details of the internal structure of block 44 absent the read back and wrap around flag logic shown in FIG. 3, including for example, the mirror address generator and mirror register that typically respond to the CNTLD and CNTRST counter control command signals by storing and producing the last loaded address or zero address (shown in FIG. 4) onto the counter register, via selection in the next state address generator, and eventually to the memory decoder according to a preferred embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
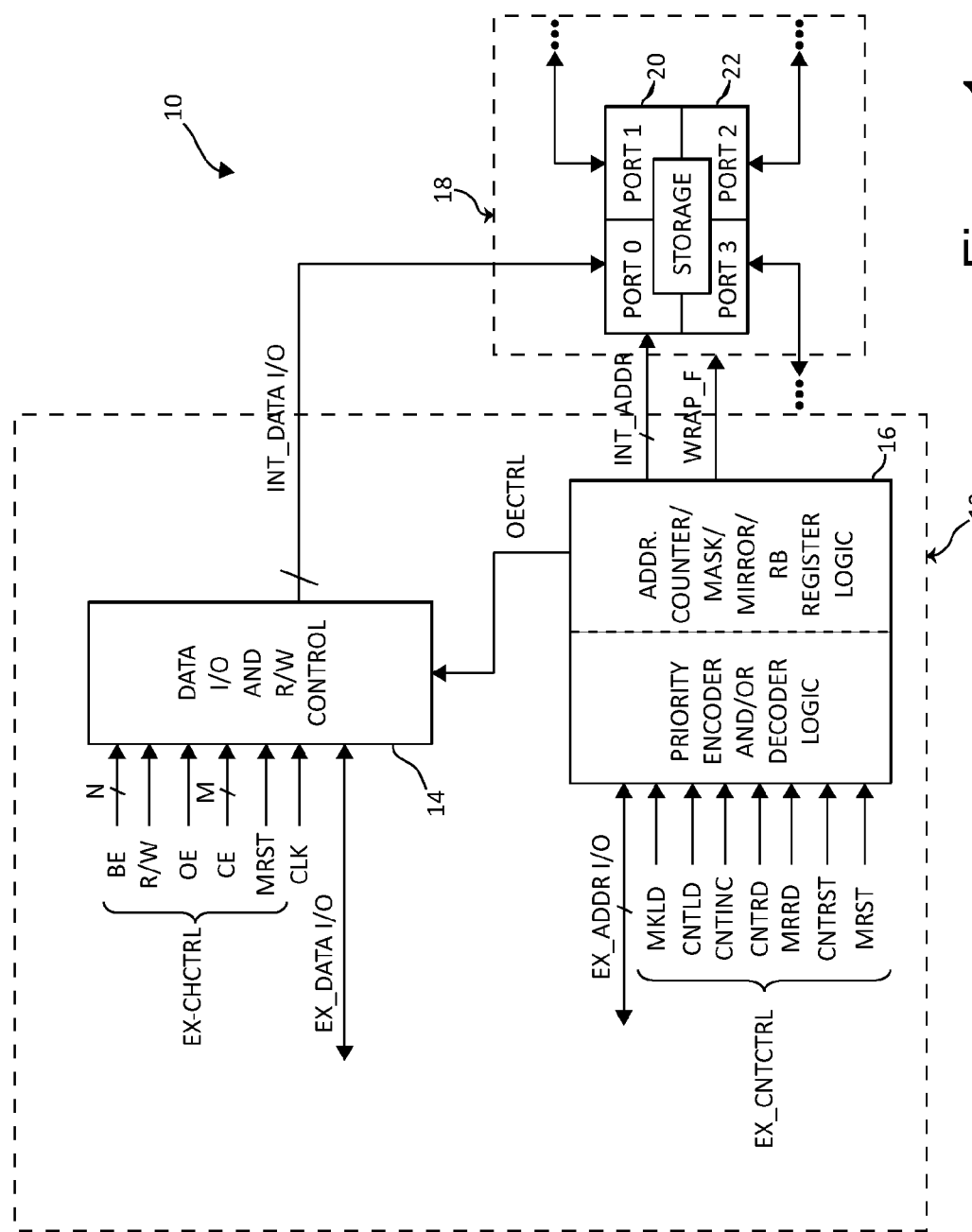
FIG. 1 is a block diagram of a multi-port memory device whose outputs are controlled by byte, read/write, chip enable, and output enable signals, wherein the internal addressing and the address I/O tri-state as well as part of the I/O tri-state data are controlled by a burst counter which can have certain addresses masked and can be loaded with a particular address or incremented to the next unmasked address.

Turning now to the drawings, FIG. 1 illustrates at least a portion of a memory controller/device 10. Controller portion 12 includes a data input/output (I/O) and read-write control block 14, as well as an address control and a priority encoder and/or decoder logic for the counter control signals block 16. The memory devices portion 18 can include a single port or a multi-port memory 20. Contained within the ported memory 20 is an array of storage cells 22. Storage cells 22 comprise semiconductor memory storage elements that can be accessed through an internal address bus INT_ADDR. The data, depending on whether a read or write operation occurs, can be written to or read from the memory device 18 via INT_DATA I/O bus.

For sake of brevity in the drawings, the memory controller 12 is shown applicable to port 0 of memory 18. However, it is recognized that the memory controller 12 is replicated for all of the ports depending on how many ports might be used. Moreover, it is understood that the controller portion 12 and the memory portion 18 can be embodied either on the same monolithic substrate or across multiple monolithic substrates. In addition, the communication between controller 12 and device 18 is internal to the controller/device. However, communication from an execution unit to system 10 occurs externally via EX_ADDR I/O, EX_DATA I/O, and the external counter control EX_CNTCTRL and chip control EX_CHCTRL signals.

System 10 can be configured to externally read on the external address bus (in other words, the EX_ADDR I/O bus can be bidirectional) and to read data in or read data out via the external data bus (EX_DATA I/O). Reading and writing operations or accesses generally occur through control logic 14 via byte manipulation (BE bus), read/write control (R/$\overline{\text{W}}$), output enable (OE), chip enable (CE bus), and master reset (MRST) signals. Such signals can be synchronized to an external clocking signal (CLK) to manipulate the data into or data out of memory device portion 18. For exemplification purposes, the size of the BE bus is limited to 2 bits only. If so limited, then UB may be the upper byte, LB may be the lower byte, and depending on which control signal is asserted (note that the Endian signals are not illustrated in FIG. 1), the upper or lower byte might be manipulated first depending on the Endian format chosen. Signals such as read/write (R/$\overline{\text{W}}$), output enable (OE), and chip enable (CE) are well-known to enable the data output or the particular chip at which the memory device is embodied.

Memory device 18 and, specifically, storage cells 22 can be implemented as a RAM. Shown are four ports which form a quad-port RAM and, more preferably, a quad-port SRAM (static RAM) device. Ports 0-3 may permit independent, simultaneous access for read/write from/to any location within storage array 22. For example, one of the ports may write to a particular location of memory storage array 22, while another port may read from other locations or the same location simultaneously, the latter of which may have certain timing constraints. An arbitration block might decide which block gets access in case of a potential contention, i.e., conflicting operations coming from different ports (e.g., when 2 or more ports attempt to simultaneously write to the same memory location).

Data I/O control circuit 14 may typically internally generate, for example, upper byte read, upper byte write, lower byte write, and lower byte read signals depending on which format is chosen to output or input the data. Such signals may control the data flow on the internal data I/O bus shown in FIG. 1 (although the system 10 may have separate data read and data write internal busses). Control block 16 performs various functions for addressing memory device 18, and bridges the external address bus (EX_ADDR I/O) and the internal address bus (INT_ADDR). Various control signals grouped as an external counter control bus (EX_CNTCTRL) are labeled as MKLD, CNTLD, CNTINC, CNTRD, MKRD, CNTRST, and MRST (this Master Reset is generally not specific to block 16; note that it was as well included as an input to the control block 14). MKLD represents a mask register load signal. CNTLD and CNTINC represent counter register load and increment command signals. Both MLKD and CNTLD use the EX_ADDR I/O bus as an input bus to present the address that is to be stored internally. Their "counterparts", mask read (MKRD) and counter read (CNTRD) command signals, use the EX_ADDR I/O bus as an output bus that presents the internal mask or counter register content to be read out by the external system (external to system 10), The counter and/or mask registers can be reset via CNTRST and/or MRST. The details of the counter mask, and read-back registers, as well as the logic used to control such registers are contained within the control circuit 16. These details are further explained in reference to FIG. 3.

As shown in FIGS. 1 and 3, block 16 may be implemented as a single-port counter 44 in FIG. 3 (identically—or slightly modified—multiplied by the number of ports in case of a multi-port), with mask, mirror, and read-back capability and/or a synchronous address counter with reset (synchronous and/or asynchronous), parallel load, variable width incrementation, and/or wrap around flagging capability. In a particular example, the counter will be considered to be a 16-bit wide counter. Control circuit 16 may also include a 16-bit mask, mirror, and counter register with parallel load and asynchronous/synchronous initialization capability as well as wrap around address control for the 16-bit synchronous counter. A wrap around flag (WRAP_F) may be activated for one or more clock cycles slightly before or after the unmasked portion of the counter is reset—or brought to the retransmit address—through an incrementation operation. In the case when each counter control signal has a dedicated external pin, the user could simultaneously activate several of the control signals. Conflicting external simultaneous active control pin states may be eliminated internally using a priority encoder and decision logic portion 48 of block 16. The decision logic can determine which of the active control pins takes precedence if, for example, multiple control pins are activated simultaneously by the user, externally. Whenever the counter control scheme presupposes the simultaneous external activation of several bits-part of the external counter control bus, in order to activate a certain counter control mode, a decoder would be used inside block 48. The former control scheme is generally used with quad ports, while the latter generally with dual ports.

Figure 2:
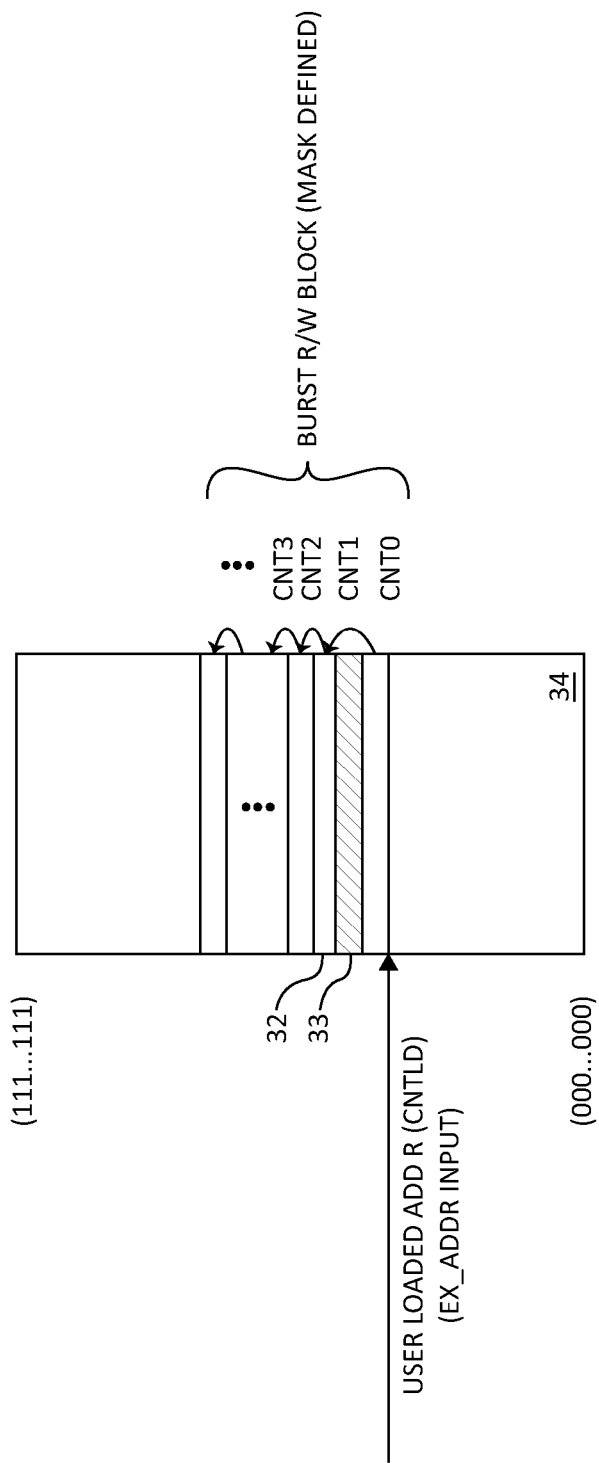
FIG. 2 is a memory address space having a user-loaded address from which a counter can increment synchronous to subsequent unmasked addresses upon sequential clock edges within a block of the address space whose limits are user-defined through masking.

Referring to FIG. 2, a typical burst operation for performing a block read or write is shown. Specifically, a user might load a certain address by, for example, asserting a counter load (CNTLD) signal on the external counter control bus (EX_CNTCTRL) and loading a particular address via EX_ADDR I/O into control block 16. Control block 16, which contains a burst counter, will then begin the count operation at, for example, a count of CNT0 value (CNT0 could be address 0, in particular, but in general it is a different address, the base address for the burst block of interest). Thereafter, the counter increments to the next unmasked count value, determined with the aid of a mask register that may be contained within block 16. The mask register stores the mask configuration, i.e., the information about which bits are skipped by an incrementation operation As illustrated in FIG. 2, masked address 30 is skipped when the counter increments or decrements, so that the counter will then point to the next unmasked address 32. The counter continues its count operation until preferably the entire block is read/written. An important benefit is the fact that the external address needs to only be asserted and loaded internally during the first address access within the block; thereafter is not tied up, accessed, or used. The internal counter will thereafter generate the subsequent addresses (through incrementation or decrementation) to access the storage array which will subsequently produce the data from the contiguous, unmasked addresses. Also, even though the addressable storage region 34—beginning with the all 0's (000 . . . 000) to the last addressable storage region (111 . . . 111)—can be quite large, it may be only necessary to repeatedly burst read/write the region shown as BURST R/W BLOCK (MASK DEFINED) in FIG. 2. A user can go directly to the first address by simply asserting an external address (EX_ADDR INPUT) and then burst read/write that block on synchronous, subsequent clock cycles and, if necessary, repeatedly doing so without involving other regions of the memory address space 34.

Turning now again to FIG. 3, a more detailed block diagram of control block 16 is shown along with data I/O and R/W control block 14 and the address decoder 40 associated with memory portion 18 (FIG. 1). In particular, in FIG. 3 block 16 also illustrates a read-back operation in which either the address stored in the counter register or the mask configuration stored in the mask register (illustrated as a combined bus CNT_OUT & MK_OUT) can be read back as selected through a MUX_CTRL (selection control) signal to a read-back multiplexer 42. The internal address, stored in the counter register, is simply the next state of a state machine whose output is being masked using the mask configuration stored in the mask register. The address state machine, registers, and register logic is shown generically as reference numeral 44. The logic also produces the output enable control (OECTRL) signal which controls the high impedance state of both the data I/O bus (EX_DATA I/O, off of block 14) and address I/O bus (EX_ADDR I/O, off of block 46).

Once multiplexer 42 selects between its CNT_OUT and MK_OUT input buses using its MUX_CTRL selection control input, the result (counter or mask register content) is then read back via the read-back bus RB_ADD_OUT to the address input/output buffers 46. Buffers 46 are bidirectional, being able to not only buffer an incoming address from EX_ADDR I/O into block 44 via ADDR_IN, but also buffer an output address via the read-back operation. Thus, the EX_ADDR I/O bus is also bidirectional. The user can thus read on the external address bus EX_ADDR I/O the current internal address that is pointed to by the counter and/or mask configuration. Generally, through the OECTRL signal, only one of the mentioned bidirectional buses (EX_DATA I/O and EX_ADDR I/O) are in output mode at any given time, but this might not necessarily be so (i.e., they might both put out information at the same time, although because of the typical latency in such memory devices, the information might pertain to different clock cycles). The address and data are sent on the external address and data buses back to, for example, an execution unit which might manipulate that address and data or simply present that data and address to an input/output device. A third output device might be simply an electronic display where the user can then visually examine the current state of the counter and, more specifically, the address and data to which the counter points.

Of significance is a priority decision (encoder) block and/or decoder logic 48. Block 48 receives the external counter control signals, generically referred to as any control signal for controlling an address value. The external control bus (EX_CNTCTRL) can have one or more component signals active. As shown in FIG. 1, for example, if only the MKLD signal of the external counter control bus is active, then the mask register will be loaded with the information presented externally on the EX_ADDR I/O bus. The same would apply (for the counter register, rather than the mask register) if only the CNTLD signal is active. A read-back of the mask register would occur if the MKRD signal was active, and a read-back of the counter would occur if the CNTRD was active. If the CNTINC is active, then the counter will be incremented. Likewise, if the CNTRST or the MRST is active (the latter can be, generally, asynchronous in nature), then the counter and/or mask and/or mirror registers will be reset, respectively, to a 0 logic value at least in their unmasked portions (generally the mask register is set—all bits at 1—during its reset, although an implementation with all its bits at 0 is not excluded). It may be that more than one signal line of the bus EX_CNTCTRL may be active in order to perform a specific mode of operation. For example, block 48 may assign a priority to one of the signals if multiple signals are active. The priority encoder and/or decoder logic block 48 may, therefore, assign precedence to a reset rather than a load signal. Also, block 48 may contain decoder logic which may assign an altogether different control by decoding all of the incoming signals and assigning an altogether new control if two or more signals are active (generally, but not necessarily, the dual port counter control scheme). The following Table 1 indicates what would occur in the priority decision logic if only one signal were active (generally, but not necessarily, the quad port counter control scheme), showing an active low (L) state:

TABLE 1

| CLK | MRST | CNTRST | MKLD | CNTLD | INCDEC | Operation |
|---|---|---|---|---|---|---|
| X | L | X | X | X | X | CNT reset and MK set |
| L-H | H | L | X | X | X | CNT reset |
| L-H | H | H | L | X | X | Load ADDR into MK |
| L-H | H | H | H | L | X | Load ADDR into CNT |
| L-H | H | H | H | H | L | CNT increment/decrement |
| L-H | H | H | H | H | H | CNT hold |

A particular example is outlined in Table 1: if more than two of the signals are active (low), then the priority encoder logic 48 may assign internally the control mode that has the highest precedence. Additional modes will be introduced in the following, such as a retransmit (RTX) operation that can be output from block 48, as will be described in more detail in reference to FIGS. 4-5 (note that the RTX counter control input signal was not included in the illustration of FIG. 1, but it has to be part of a EX_CNTCTRL—quad port scheme—bus if the operation is to be made available to the internal burst counter).

Turning now to FIG. 4, an addressable space 50 is shown whereby a user-loaded address can be accessed via EX_A-DDR I/O bus. Thereafter, the counter will increment the address forwarding the counter register to the next address value that is unmasked. The masked address 52 is shown in cross-hatch. For example, the counter will skip the first masked address 52, and address the second unmasked address 54 at the first count value CNT1. Thereafter, the counter will naturally progress until the last count value is read at CNTN and, in the interim, skipping any masked addresses. It would be desirable to store certain addresses. Those addresses can be stored in a mirror register to be described below. For example, the stored address might be the last address loaded into the counter register via the external address bus (EX_A-DDR I/O). That address is shown in this example as a user-loaded address (through a CNTLD operation). It may also be desirable to quickly go (i.e., jump) to the first unmasked address within the user addressable space 50. That address might be at the (000...000) address, or at least might have all its unmasked bits at logic 0. A control signal can be either externally sent or internally derived to allow the counter to reinitialize back to the last-loaded address (retransmit) or to the address containing all logic 0 voltage values at least in its unmasked portion. Those control signals are represented generically as RTX (retransmit) and WRP0 (wrap to address 0—generally post masking).

Shown in the blow-up of FIG. 4, generally a RTX command sends the counter back to the last-loaded address (assumed CNT0), and so does a counter wrap around when the WRP0 control signal is inactive (which would designate a "wrap around to retransmit" rather than a "wrap around to unmasked-address 0"). It may be that in the interim, the last-loaded address is masked. If so, then the counter will be automatically incremented 56 to the first, subsequent address that is not masked. Thus, a jump to CNT0 (or the first unmasked address in the burst block of interest) can occur under a normal counter load (CNTLD), or a counter retransmit (RTX), or a "wrap around to retransmit" (WRP0 inactive) as shown on the upper portion of the blow-up of FIG. 4. Illustrated in the bottom portion of the blow-up of FIG. 4 is the jump to "unmasked address 0," which can occur under a normal counter load (CNTLD), or a counter reset (CNTRST), or a "wrap around to unmasked-address 0" (WRP0 active).

Referring to FIG. 5, reference numeral 16a describes only a portion of that which is shown in FIG. 3. For example, item 16a illustrates a logic block 48 receiving the external counter control bus (EX_CNTCTRL) implemented as a multi-bit counter control bus which must necessarily include a retransmit control. Another signal ADDR_IN can be implemented also as a multi-bit address bus. The address input bus ADDR_IN as well as the mask register output (MK) is sent to a mirror address generator block 50 along with certain internal counter control signals associated with the counter. In a particular case, those control signals can be a counter load (CNTLD) and/or a counter reset (CNTRST). The counter load and counter reset control signals can be internally or externally derived. For example, the counter load can be derived by decoding two or more control signals (for the most general dual port counter control scheme) upon the external control bus via decoder logic 48. The counter reset may be sent externally via one of the external counter control signals or can be, also, derived internally via decoder logic 48. The same applies to the wrap to 0 control signal (WRP0), shown in dashed line to illustrate the above. Whether produced externally or internally, the control signals will indicate a retransmit (RTX) or a "wrap to the last-loaded address," or a "wrap to 0" (to the address containing all logic 0 voltage values at least in the unmasked bits), both of which might cause the next state address generator 54 to route the mirror address (MR_ADDR)—stored in the mirror register 52—to the counter register 60 as the NXT_STATE internal signal. The mirror address generator 50 is the one that produces a particular signal NXT_MR_ADDR that gets stored into the mirror register 52 at the next active clock (CLK) transition. Besides the mirror address MR_ADDR (stored in the mirror register 52), the multiplexer 54 can also select another of its inputs (e.g., ADDR_IN, ADDR_OUT, or INCR_STATE) to become the NXT_STATE signal at its output in response to a select signal that might contain as a subset internal counter control signals like RTX, CNTINC, WRP0, or CNTLD, and to the MK signal. The INCR_STATE signal is generally the output from a partially maskable incrementer 56 controlled by the ADDR_OUT and a subset (MK_LSB) of the mask register internal bus signals (MK) stored and produced by the mask register 58 at each active clock transition in response to the ADDR_IN and a mask load MKLD signal. The incrementer is controlled by a subset of the mask register internal bus signals (generally not more than a few LSBs are masked in the incrementer)—thus being partially maskable, because of the requirement for a 3-contiguous-region mask needed for cross-port word size multiplication as described, e.g., in U.S. Pat. No. 6,782,467. As the internal address-stored in the counter register as ADDR_OUT—is incremented via the partially maskable incrementer 56 (INCR_STATE), the address out of the multiplexer (in the case of an incrementation operation) becomes NXT_STATE and is also subsequently masked (using the MK signal that is input of the multiplexer 54) so that the incremented address stored in the counter register 60 at the next active clock transition is only incremented in its unmasked bits.

Therefore, the entire feedback loop shown for the counter register 60, through the multiplexer 54, is a state machine that can either continue the incrementing function of INCR_STATE to NXT_STATE, or can take the mirrored address value on the MR_ADDR bus and apply that to the output NXT_STATE, or can hold the same internal address by "recycling" ADDR_OUT, or can apply ADDR_IN to become NXT_STATE, depending on the status of the multi-bit select signal shown on the S pin of multiplexer 54. Thus, multiplexer 54 receives the MK, ADDR_IN, ADDR_OUT, INCR_STATE, MR_ADDR, and a set of uniquely decoded counter control signals (e.g., CNTINC if the counter is simply to be incremented/decremented—decrementation taking place in response to an additional UP/down control signal, not shown—to the next unmasked address, CNTLD if the external address is to be loaded, or RTX and/or WRP0 control signals if the counter is to execute a retransmitted or be wrapped to retransmit or unmasked-address 0 based on the mirror address). Thus, multiplexer 54 also receives the mirrored address of, for example, the last user-loaded address or the address containing all logic 0 voltage values in its unmasked portion. The signal NXT_STATE may be implemented as a multi-bit bus, and whatever the address output from multiplexer 54 via NXT_STATE is then stored in counter register 60 to be placed into the address decoder of the memory device via the internal address out bus (ADDR_OUT).

The partially maskable incrementer 56 may shift down the bits of the present state via the address out (ADDR_OUT) signal with the number of masked LSBs in the input stage of incrementer block such that the first unmasked bit in the bits ADDR_OUT of the counter register 60 starting from the LSB is routed to the LSB of the binary incrementer block. The increment signal INCR_STATE may correspond to a shift up operation complementary to the shift down operation. Thus, the incremented (unmasked) bits may be routed back to their proper rank.

The NXT_STATE value can be represented as an up count value or a down count value placed into the counter register to produce the appropriate address output to the memory device. No matter what signal is routed by the multiplexer 54 to become NXT_STATE, the NXT_STATE is internally derived and does not involve taking control of and/or otherwise placing an address upon the external address bus. Once the NXT_STATE is derived and the output address is produced, the subsequent count value that are unmasked generate, e.g., a new INCR_STATE and the NXT_STATE is automatically updated, also without taking control of the external address bus.

Burst counter 46 can perform a jump to the last-loaded address without taking control of the external address bus, or without externally loading that address to the counter through a regular counter load operation. Moreover, the burst counter 46 can perform a rollover to the retransmit (mirror) address or the unmasked-address 0, also without taking control of the external address bus. Regardless of any counter load precedence, whereby a counter hold may have lower precedence and be "disregarded" during a counter reset, the internally mirror-stored and/or derived unmasked-address 0 can be placed on the internal address output bus (ADDR_OUT) subsequent to a counter wrap around without performing an external reset and/or setting a counter interrupt to effect the reset through an external (to the memory device) feedback loop.

Mirror register 52 preferably has the same bit size and clocked synchronously with the counter register 60 and mask register 58. Mirror register 52 stores the last-loaded address or the all 0's (at least in its unmasked bits) address ready to be thereafter parallel-loaded into the counter register 60 whenever an RTX and/or wrap around (controlled by WRP0) operation is initiated for that counter. Block 48 can decode the RTX signal and, through a delay block, a WRP0 signal can be sent externally so that the RTX and WRP0 can arrive to the select control pin of the multiplexer 54 at the same time. The RTX and WRP0 can, therefore, be part of the counter control signal generically sent over an internal or external counter control bus. The mirror register output is preferably parallel-loaded, via multiplexer 54, into the counter register 60.

Beneficially, the last-loaded address and the unmasked-address 0 are internally stored, eliminating the need for any external system to have the last-loaded address or the unmasked-address 0 information. There is also no need for an external feedback connection or for a complex interaction between the maximum count state flag (WRAP_F) and the rollover through a counter reset, which is difficult to handle in a multiple-cycle latency (pipelined) memory. The counter register 60 can be incremented or be simply held in the max count state because the interaction with rollover to unmasked-address 0 through the counter reset is eliminated. Counter register 60 can simply jump to the last loaded address without impacting system resources. There is no need for the memory to take control of the external address bus for a retransmit operation, because the operation is now controlled entirely internal to the memory controller/device.

The decoder logic can be used to reduce the number of external counter control pins (generally used in the dual port counter control schemes) by decoding two or more counter control signals—part of an encoded external counter control bus—to produce the particular control mode desired (i.e., RTX). Generally, however, a separate WRP0 pin would be used in order to specify the user-controlled rollover, although this signal could be incorporated in the counter control set of signals to be decoded.

It will be appreciated to those skilled in the art having the benefit of this disclosure that this invention is believed to provide an improved reloading of a last loaded address or zero unmasked-address without involving the external address bits sent to the memory device. Instead, only the control signal states, or a new control signal, are changed to implement the improved reloading method, without needing to access or take control of the external address bus. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A memory controller comprising:
   a counter configured to receive a base address via an external bus system and to perform a count operation beginning at the base address received by the counter; and
   a mirror address generator configured to provide a mirror address to the counter via an internal bus system, exclusive of the external bus system, wherein the base address is a first memory address and the mirror address is a second memory address,
   the counter configured to receive the mirror address responsive to a counter reinitialize command, and to perform a further count operation beginning at the received mirror address.

2. The memory controller as recited in claim 1, wherein the mirror address generator is configured to generate the mirror address in response to at least one of a counter load command and a counter reset command, and to forward the mirror address to a mirror register to be stored by the mirror register.

3. The memory controller as recited in claim 1, wherein the mirror address generator is configured to generate the mirror address including all logic zeros in response to a counter reset command and the counter is reinitialized to the mirror address that contains the all logic zeros.

4. The memory controller as recited in claim 1, wherein the base address is user loaded.

5. The memory controller as recited in claim 1, wherein the memory controller is communicatively coupled with a synchronous memory, the synchronous memory configured to be written to or read from a non-masked addresses of the synchronous memory based on sequential transitions of a clocking signal.

6. The memory controller as recited in claim 5, wherein the synchronous memory includes a multi-port memory, wherein one port of the multi-port memory is configured to receive output from a memory address decoder.

7. A system comprising:
a random access memory (RAM) including a plurality of memory cells, each memory cell identifiable through a memory address;
a processing system communicatively coupled with the RAM and configured to access a block of memory cells, of the plurality of memory cells; and
a memory controller communicatively coupled with the RAM and the processing system, the memory controller including:
a burst counter configured to receive a load address from the processing system via an external bus system and to perform a counting operation beginning at the load address received from the processing system; and
a mirror address generator configured to generate a mirror address responsive to at least one of a counter load command and counter reset command and to cause the mirror address to be stored in a mirror register, wherein the load address is a first memory address and the mirror address is a second memory address, the burst counter configured to:
receive, responsive to a counter reinitialize command, the mirror address from the mirror register via an internal bus system, exclusive of the external bus system; and
perform a further counting operation beginning at the received mirror address.

8. The system as recited in claim 7, wherein the burst counter, responsive to the reinitialize command is configured to retransmit beginning at the mirror address subsequent to the counting operation, wherein the mirror address generated by the mirror address generator is the load address.

9. The system as recited in claim 8, wherein the mirror address generator is configured to generate a mirror address that includes all logic zero values, responsive to the counter reset command.

10. The system as recited in claim 8, wherein the burst counter, responsive to the reinitialize command is configured to retransmit beginning at the mirror address containing the all logic zero values, subsequent to the counting operation.

11. The system as recited in claim 7, wherein the counting operation performed by the burst counter includes incrementing or decrementing beginning with at least one of the load address and the mirror address.

12. The system as recited in claim 7, further comprising:
a mask register configured to store masked addresses, wherein the burst counter is configured to receive the masked addresses and to increment at least one of the load address and the mirror address to a next non-masked address.

* * * * *